US011251762B2

(12) United States Patent
Horiguchi (10) Patent No.: US 11,251,762 B2
(45) Date of Patent: Feb. 15, 2022

(54) AMPLIFIER (71) Applicant: Mitsubishi Electric Corporation, Tokyo (JP)

(72) Inventor: Kenichi Horiguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 14 days.

(21) Appl. No.: 16/759,296

(22) PCT Filed: Jan. 22, 2018

(86) PCT No.: PCT/JP2018/001760
§ 371 (c)(1),
(2) Date: Apr. 24, 2020

(87) PCT Pub. No.: WO2019/142354
PCT Pub. Date: Jul. 25, 2019

(65) Prior Publication Data
US 2021/0050831 A1 Feb. 18, 2021

(51) Int. Cl.
*H03F 1/07* (2006.01)
*H03F 3/60* (2006.01)
(Continued)

(52) U.S. Cl.
CPC ........... *H03F 3/602* (2013.01); *H03F 1/0277* (2013.01); *H03F 1/565* (2013.01); *H03F 3/245* (2013.01)

(58) Field of Classification Search
CPC .................................. H03F 1/07; H03F 1/0288
(Continued)

(56) References Cited

U.S. PATENT DOCUMENTS 6,342,812 B1 * 1/2002 Abdollahian ......... H03F 1/0277
330/124 R
7,411,450 B2 * 8/2008 Albrecht ............ G01R 33/3621
330/124 R
(Continued)

FOREIGN PATENT DOCUMENTS

JP H11112252 A 4/1999

OTHER PUBLICATIONS

International Search Report; Written Opinion; and Notification of Transmittal of the International Search Report and the Written Opinion of the International Searching Authority, or the Declaration issued in PCT/JP2018/001760; dated Apr. 10, 2018.
(Continued)

*Primary Examiner* — Henry Choe
(74) *Attorney, Agent, or Firm* — Studebaker & Brackett PC (57) ABSTRACT Examples of an amplifier includes an input divider section having a first path and a second path for branching of an input signal, wherein a passing phase at the first path and a passing phase at the second path are different; a first amplifying element that amplifies a signal input to the first path; a second amplifying element that amplifies a signal input to the second path; an output synthesizing section that performs synthesis of an output of the first amplifying element and an output of the second amplifying element with a third path for transmitting the output of the first amplifying element and a fourth path for transmitting the output of the second amplifying element, wherein a passing phase at the third path and a passing phase at the fourth path are different; and an electromagnetic coupling section that establishes electromagnetic coupling of two signals.

17 Claims, 7 Drawing Sheets

(51) Int. Cl.
*H03F 1/02* (2006.01)
*H03F 1/56* (2006.01)
*H03F 3/24* (2006.01)

(58) Field of Classification Search
USPC .............................................. 330/124 R, 295
See application file for complete search history.

(56) References Cited

U.S. PATENT DOCUMENTS

| 9,484,866 B2 * | 11/2016 | Sun .......................... H03F 3/211 |
| 2003/0030895 A1 | 2/2003 | So et al. |
| 2004/0189380 A1 * | 9/2004 | Myer ........................ H03F 3/602 |
| | | 330/124 R |
| 2013/0241640 A1 | 9/2013 | Lin et al. |

OTHER PUBLICATIONS

E. Geron et al, Electronically controlled asymmetric microstrip line coupler underpinned by an hybrid right-/left-handed line, IET Microw. Antennas Propag., vol. 6, pp. 1136-1141, Apr. 2012.
Office Action issued in TW 107113840; mailed by the Taiwan Intellectual Property Office dated Jul. 26, 2018.
Office Action issued in TW 107113840; mailed by the Taiwan Intellectual Property Office dated Apr. 8, 2019.

* cited by examiner

AMPLIFIER

FIELD

The present invention relates to an amplifier.

BACKGROUND

In the trend of increase in communication capacity, wireless communications necessitate amplification of signals with a wider band or signals that span multiple frequency bands. Also, wireless transmitters are required to reduce power consumption due to demands for reduction in the size of heat dissipation features as well as reduction in running costs. As a result, it is important in high frequency amplifiers to achieve high efficiency over a wide frequency range.

The patent literature PTL 1 discloses a high frequency amplifier. PTL 1 also discloses an amplifier that carries out branching of an input signal so that branched signals advance into two paths, and amplification of the branched signals, and subsequent synthesis of these signals, where a 90 degree hybrid circuit is disposed between the amplifier and an output synthesizing circuit. By virtue of this, output matching that is open to the fundamental wave of the input signal and short-circuited to the second harmonic is created and thereby high efficiency of the amplifier is realized.

PRIOR ART

Patent Literature

[PTL 1] JP H11-112252 A

SUMMARY

Technical Problem

In the conventional high frequency amplifier, the frequency band where high efficiency can be obtained is limited to a narrow band due to the frequency characteristics of the circuit including a semiconductor, which makes it difficult to achieve high efficiency over a wider band.

The present invention has been made to solve the above-identified problem and an object of the present invention is to provide an amplifier that operates with high efficiency over a wide band in a configuration where an input signal is subjected to branching so that the branched signals advance into and pass through two paths, and each of the branched signals is amplified, subjected to synthesis and then output.

Means for Solving the Problems

According to a present invention, an amplifier includes an input divider section having a first path and a second path for branching of an input signal, wherein a passing phase at the first path and a passing phase at the second path are different from each other, a first amplifying element that amplifies a signal input to the first path, a second amplifying element that amplifies a signal input to the second path, an output synthesizing section that performs synthesis of an output of the first amplifying element and an output of the second amplifying element with a third path for transmitting the output of the first amplifying element and a fourth path for transmitting the output of the second amplifying element, wherein a passing phase at the third path and a passing phase at the fourth path are different from each other, and an electromagnetic coupling section that establishes electromagnetic coupling of two signals passing through the input divider section to be input to the first amplifying element and the second amplifying element, or two signals output from the first amplifying element and the second amplifying element and input to the output synthesizing section.

Other features will be disclosed below.

Advantageous Effects of Invention

According to the present invention, an amplifier that operates with high efficiency over a wide band can be provided by electromagnetically coupling two branched signals.

DESCRIPTION OF EMBODIMENTS

An amplifier in accordance with an embodiment will be described with reference to the drawings. The same or corresponding components will be denoted by the same reference numerals, and repeated description may be omitted.

First Embodiment

Figure 1:
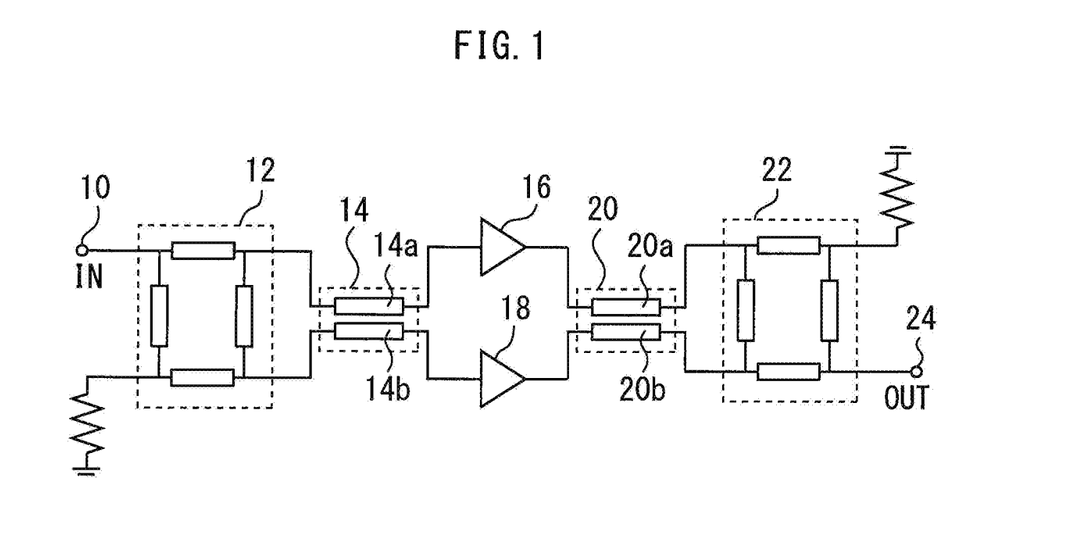
FIG. 1 is a configuration diagram of an amplifier in accordance with the first embodiment.

FIG. 1 is a configuration diagram of an amplifier in accordance with the first embodiment. An input divider section 12 is connected to an input terminal 10. The input divider section 12 has, for example, a 90 degree hybrid circuit. The input divider section 12 has a first path and a second path into which an input signal subjected to branching advances to pass therethrough. The first path is a path that extend from the input terminal 10 to a first amplifying element 16. The second path is a path that extends from the input terminal 10 to a second amplifying element 18. The passing phase at the first path and the passing phase at the second path are different from each other.

An electromagnetic coupling section 14 is connected to the input divider section 12. The electromagnetic coupling section 14 is provided between the input divider section 12 and the amplifying elements, i.e., the first amplifying element 16 and the second amplifying element 18. FIG. 1 depicts the state where a coupling circuit is used as the electromagnetic coupling section 14. The electromagnetic coupling section 14 includes a first portion 14a and a second portion 14b in proximity to the first portion 14a. The signal passing through the second portion 14b is superimposed upon the signal passing through the first portion 14a, and the signal passing through the first portion 14a is superimposed upon the signal passing through the second portion 14b.

The first amplifying element 16 and the second amplifying element 18 are connected to the electromagnetic coupling section 14. The signal input to the first path travels through the electromagnetic coupling section 14 to be amplified by the first amplifying element 16, and the signal input to the second path travels through the electromagnetic coupling section 14 to be amplified by the second amplifying element 18.

An electromagnetic coupling section 20 is connected to the outputs of the first amplifying element 16 and the second amplifying element 18. The electromagnetic coupling section 20 is provided between these amplifying elements, i.e., the first amplifying element 16 and the second amplifying element 18, and an output synthesizing section 22. FIG. 1 depicts a state where a coupling circuit is used as the electromagnetic coupling section 20. The electromagnetic coupling section 20 includes a third portion 20a and a fourth portion 20b in proximity to the third portion 20a. The signal passing through the fourth portion 20b is superimposed upon the signal passing through the third portion 20a, and the signal passing through the third portion 20a is superimposed upon the signal passing through the fourth portion 20b.

The output synthesizing section 22 is connected to the output of the electromagnetic coupling section 20. The output synthesizing section 22 has, for example, a 90 degree hybrid circuit. The output synthesizing section 22 has a third path for transmitting the output of the first amplifying element 16 and a fourth path for transmitting the output of the second amplifying element 18. The passing phase at the third path and the passing phase at the fourth path are different from each other. By virtue of the fact that the third path and the fourth path are connected, the outputs of the first amplifying element 16 and the second amplifying element 18 are subjected to the synthesis. The signal that has passed through the output synthesizing section 22 is output to the output terminal 24.

Propagation of the signal of the amplifier configured as described above will now be described. The signal that has been input to the input terminal 10 is subjected to branching at the input divider section 12 so that branched signals advance into the first path and the second path, and a signal delayed in phase by 90 degrees is output from the first path, and a signal delayed in phase by 180 degrees is output from the second path. The signal that has been input to the first path is transmitted through the electromagnetic coupling section 14 and amplified by the first amplifying element 16, and the signal that has been input to the second path is transmitted through the electromagnetic coupling section 14 and amplified by the second amplifying element 18. At the electromagnetic coupling section 14, part of the signal leaks from the first portion 14a to the second portion 14b, and part of the signal leaks from the second portion 14b to the first portion 14a.

The signal that has been amplified by the first amplifying element 16 is transmitted through the electromagnetic coupling section 20 and input to the output synthesizing section 22, and the signal that has been amplified by the second amplifying element 18 is transmitted through the electromagnetic coupling section 20 and input to the output synthesizing section 22. At the electromagnetic coupling section 20, part of the signal leaks from the third portion 20a to the fourth portion 20b and part of the signal leaks from the fourth portion 20b to the third portion 20a. In addition, a signal delayed in phase by 180 degrees is output from the third portion 20a to the output end of the output synthesizing section 22, and a signal delayed in phase by 90 degrees is output from the fourth portion 20b to the output end of the output synthesizing section 22. These signals are subjected to the synthesis and then output from the output terminal 24.

In the amplifier of this embodiment, by virtue of the effect of the electromagnetic coupling section 14, two signal components, i.e., the signal traveling in the first portion 14a and the signal that has leaked from the second portion 14b into the first portion 14a, are input to the first amplifying element 16. Due to the difference in the passing phases between the input and output ports in the input divider section 12 configured by the 90 degree hybrid, the passing phase of the coupling component which is a component leaking from the second portion 14b and being input to the first amplifying element 16 is relatively delayed in phase as compared with the passing phase of the passing component which is a component to be input from the first portion 14a to the first amplifying element 16. This is because the passing phase at the second path is larger than the passing phase at the first path.

Likewise, two signal components, i.e., the signal traveling through the second portion 14b and the signal that has leaked from the first portion 14a to the second portion 14b, are input to the second amplifying element 18. Due to the difference in the passing phase between the input and output ports in the input divider section 12 configured by a 90 degree hybrid, the passing phase of the coupling component which is a component leaking from the first portion 14a and being input to the second amplifying element 18 is relatively advanced in phase as compared with the passing phase of the passing component which is a component to be input from the second portion 14b to the second amplifying element 18. This is because the passing phase at the second path is larger than the passing phase at the first path.

In other words, at the input ends of the first amplifying element 16 and the second amplifying element 18, the relative phase relationships between the passing component and the coupling component will be different from each other. Even when the impedance matching changes due to the frequency difference on the input side of the amplifier, the different effects will be observed between the first amplifying element 16 and the second amplifying element 18. Hence, wideband characteristics can be achieved by the amplifier as a whole.

Actually, there may be a certain phase change when the signals are coupled between two paths. However, the phase change equally occurs both in the coupling from the first portion 14a to the second portion 14b and in the coupling from the second portion 14b to the first portion 14a. For this reason, the relative phase relationship between the passing component and the coupling component is different at the input end of the first amplifying element 16, and the relative phase relationship between the passing component and the coupling component is different at the input end of the second amplifying element 18. This consequence remains the same.

A similar phenomenon occurs between the electromagnetic coupling section 20 and the output synthesizing section 22. At the one input end of the output synthesizing section 22, the presumed phase relationship is different between the passing component and the coupling component, and at the other input end as well, the presumed phase relationship is different between the passing component and the coupling component. As a result, even when the impedance matching changes due to the difference in the frequency on the output side of the amplifier, the different effects will be observed between the first amplifying element 16 and the second amplifying element 18. Hence, wideband characteristics of the amplifier as a whole can be achieved.

By providing the output synthesizing section 22 in which the passing phase from the third path to the output end is larger than the passing phase from the fourth path to the output end, signals that are substantially in phase can be output from the output terminal 24.

Figure 2:
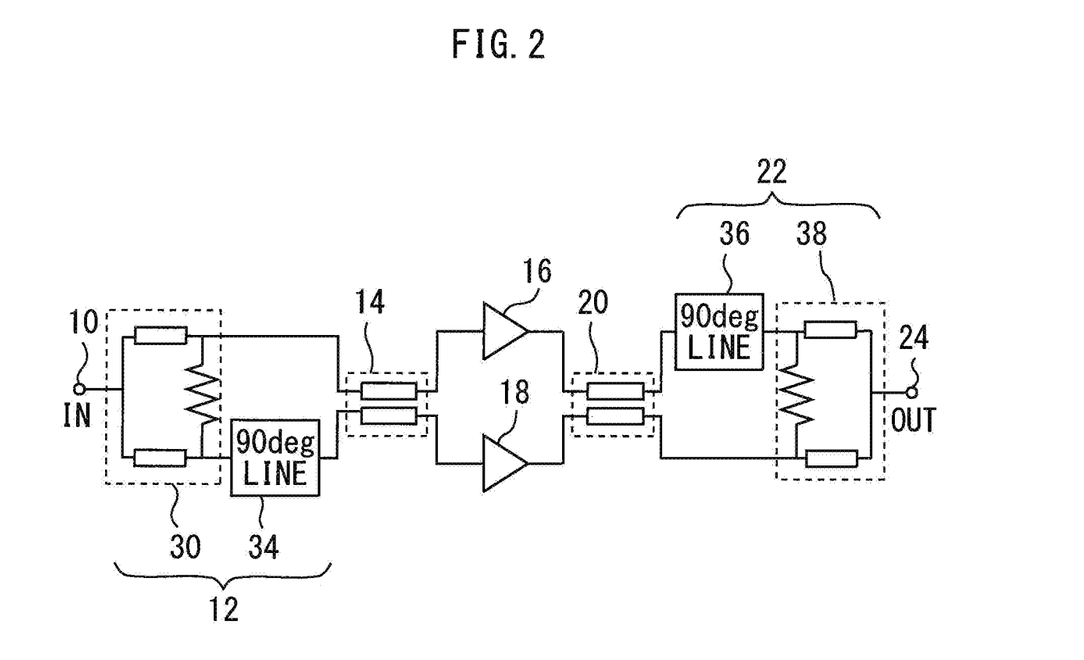
FIG. 2 is a configuration diagram of the amplifier in accordance with a modified example.

FIG. 2 is a configuration diagram of the amplifier in accordance with a modified example. The input divider section 12 includes a power divider 30 and a phase line 34. The phase line 34 can be, for example, a 90 degree line which functions as a 90 degree phase shifter. The input divider section 12 has a phase line 34 in the second path. The output synthesizing section 22 includes a phase line 36 and a power combiner 38. The phase line 36 can be, for example, a 90 degree line which functions as a 90 degree phase shifter. The output synthesizing section 22 has a phase line 36 in the third path.

By the amplifier illustrated in FIG. 2, the same operation and effects can be obtained as those of the above-described amplifier illustrated in FIG. 1. The input divider section 12 of FIG. 1 may be replaced by the input divider section 12 of FIG. 2, and the output synthesizing section 22 of FIG. 1 may be replaced by the output synthesizing section 22 of FIG. 2.

Figure 3:
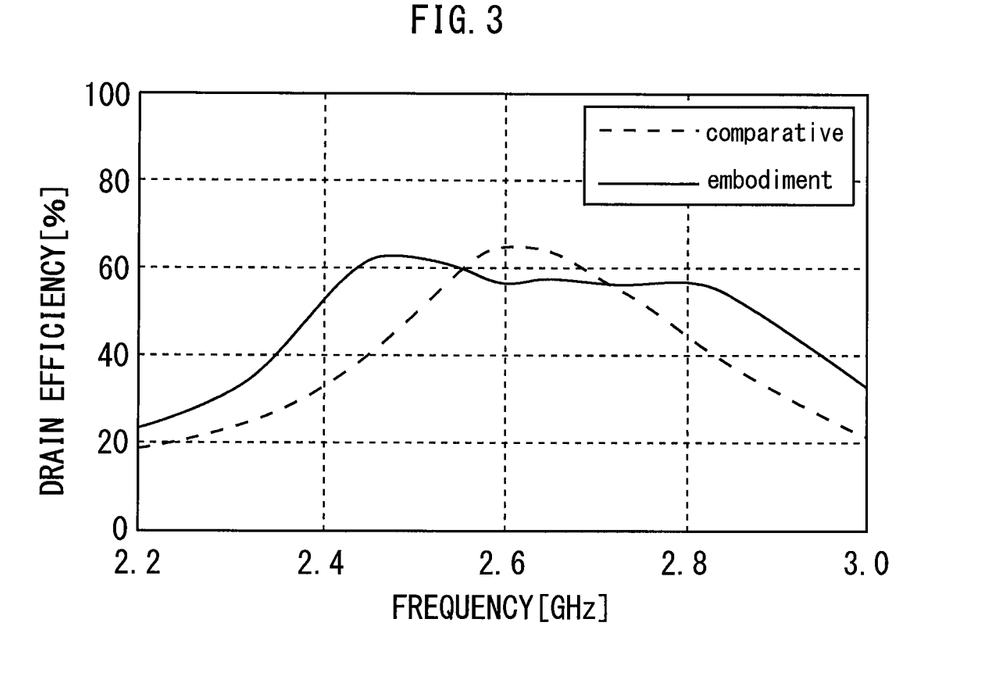
FIG. 3 is a diagram that shows frequency characteristics of drain efficiency.
Figure 14:
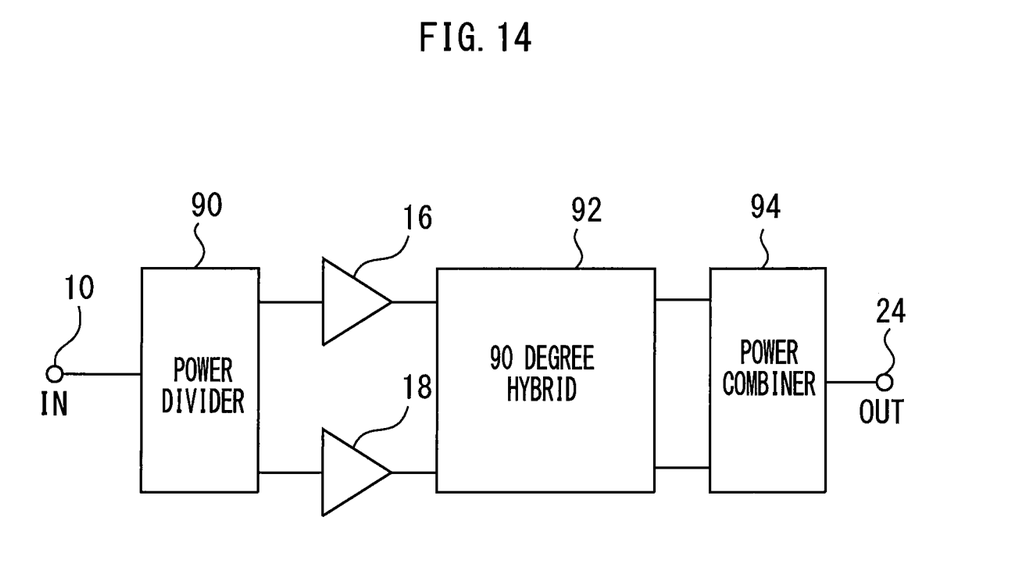
FIG. 14 is a configuration diagram of an amplifier in accordance with comparative example.

FIG. 3 is a diagram that shows the simulation results of frequency characteristics of amplifier drain efficiency. In FIG. 3, the solid line represents the simulation results regarding the amplifier of this embodiment and the broken line represents the simulation results regarding the amplifier of a comparative example. The amplifier of the comparative example is, for example, the amplifier depicted in FIG. 14. In the amplifier of the comparative example, the signal that has been divided into two portions at the power divider 90 are amplified by the first amplifying element 16 and the second amplifying element 18, pass through the 90 degree hybrid 92 and the power combiner 94, and are output from the output terminal 24. In the amplifier of the comparative example of this kind, it is possible to obtain high drain efficiency with a particular frequency but the band exhibiting high drain efficiency is narrow. In contrast, in the case of this embodiment indicated by the solid line of FIG. 3, as compared with the comparative example, the maximum value of the drain efficiency is decreased slightly, but the bandwidth exhibiting a certain drain efficiency can be widened relative to that in the comparative example. For example, the bandwidth exhibiting drain efficiency of 50% or more is wider in this embodiment than in the comparative example.

Various modifications can be made to the amplifier in accordance with the first embodiment within a range where its features are not lost. The electromagnetic coupling section 14 may adopt various configurations for establishing electromagnetic coupling of the two signals which pass through the input divider section 12 to be input to the first amplifying element 16 and the second amplifying element 18. Also, the electromagnetic coupling section 20 may adopt various configurations for establishing electromagnetic coupling of the two signals which are output from the first amplifying element 16 and the second amplifying element 18 and input to the output synthesizing section 22. In this embodiment, two electromagnetic coupling sections 14, 20 are provided. However, either of the electromagnetic coupling sections 14, 20 may be omitted, and, in that case as well, the amplifier as a whole is allowed to have wideband characteristics.

Second Embodiment

Figure 4:
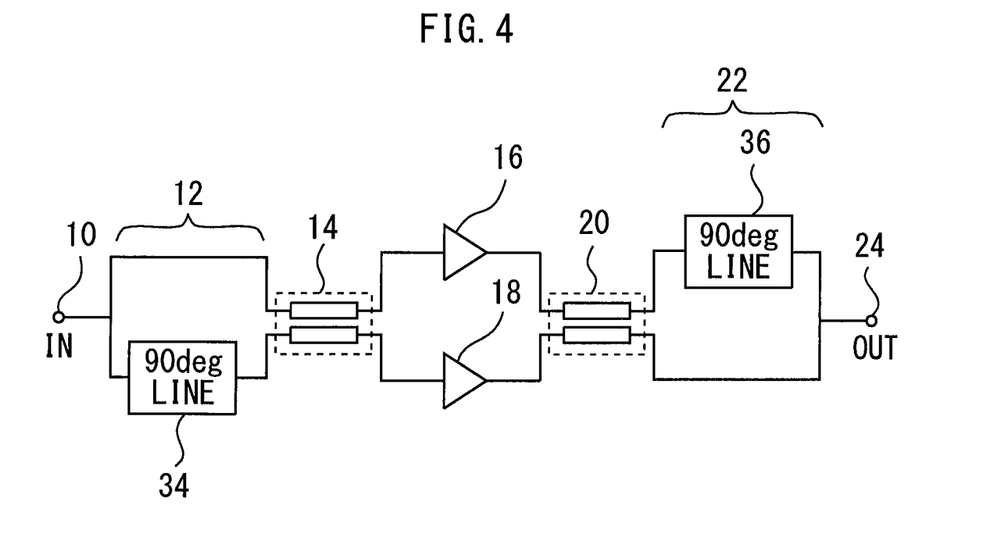
FIG. 4 is a configuration diagram of an amplifier in accordance with the second embodiment.

FIG. 4 is a configuration diagram of an amplifier in accordance with the second embodiment. The input divider section 12 has a phase line 34 in the second path and the output synthesizing section 22 has a phase line 36 in the third path. The phase lines 34, 36 can be configured by a 90 degree line. A signal that has been input to the input terminal 10 is subjected to branching at the input divider section 12 so that branched signals advance into the first path and the second path, the signal passing through the first path is output on an as-is basis, and the signal passing through the second path is output via the phase line 34.

The signal that has been input to the first path is transmitted through the electromagnetic coupling section 14 and amplified by the first amplifying element 16, and the signal that has been input to the second path is transmitted through the electromagnetic coupling section 14 and amplified by the second amplifying element 18. The signal that has been amplified by the first amplifying element 16 is transmitted through the electromagnetic coupling section 20, input to the phase line 36 of the third path, and then subjected to synthesis with the signal that has been amplified by the second amplifying element 18, transmitted through the electromagnetic coupling section 20, and has passed through the fourth path, and the synthesized signal is output from the output terminal 24.

According to the amplifier in accordance with the second embodiment, since the electromagnetic coupling sections 14, 20 are provided in the same manner as in the first embodiment, it is made possible to provide an amplifier that operates with high efficiency over a wide band. Either of the electromagnetic coupling sections 14, 20 may be omitted.

Third Embodiment

Figure 5:
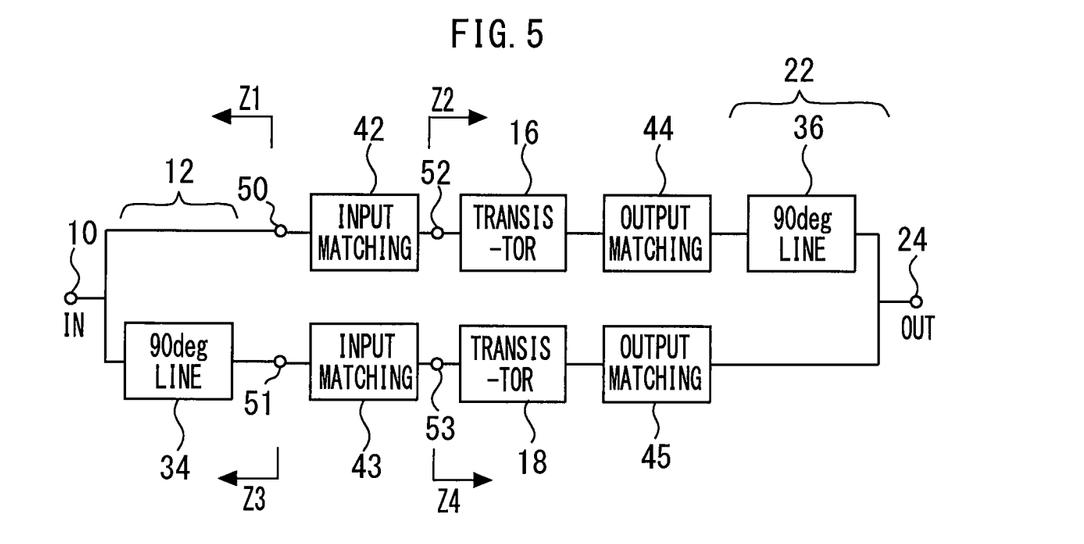
FIG. 5 is a configuration diagram of an amplifier in accordance with the third embodiment.

FIG. 5 is a configuration diagram of an amplifier in accordance with the third embodiment. A first input matching circuit 42 is provided between the first path of the input divider section 12 and the first amplifying element 16. A second input matching circuit 43 is provided between the second path of the input divider section 12 and the second amplifying element 18. A first output matching circuit 44 is provided between the first amplifying element 16 and the third path of the output synthesizing section 22. A second output matching circuit 45 is provided between the second amplifying element 18 and the fourth path of the output synthesizing section 22. The first input matching circuit 42 and the second input matching circuit 43 are in proximity to each other and the first output matching circuit 44 and the second output matching circuit 45 are in proximity to each other.

As part of the first input matching circuit 42 and part of the second input matching circuit 43 face each other without presence of a GND pattern between them, a portion exhibiting a coupling amount of −20 dB or more and −3 dB or less is provided, and this portion is configured to serve as the electromagnetic coupling section. Specifically, at a location where the first input matching circuit 42 and the second input matching circuit 43 are closest to each other, without presence of a GND pattern in between, high frequency signals are spatially electromagnetically coupled between the two input matching circuits facing each other, as a result of which it is ensured that the coupling amount between the input matching circuits becomes −20 dB or more and −3 dB or less. Accordingly, it can be said that the electromagnetic coupling section is provided in the first input matching circuit 42 and the second input matching circuit 43.

As part of the first output matching circuit 44 and part of the second output matching circuit 45 face each other without presence of a GND pattern in between, a portion exhibiting a coupling amount of −20 dB or more and −3 dB or less is provided, and this portion is configured to serve as the electromagnetic coupling section. Specifically, at a location where the first output matching circuit 44 and the second output matching circuit 45 are closest to each other, without presence of a GND pattern in between, high frequency signals are spatially electromagnetically coupled between the two output matching circuits facing each other, as a result of which it is ensured that the coupling amount between the output matching circuits becomes −20 dB or more and −3 dB or less. Accordingly, it can be said that the electromagnetic coupling section is also provided in the first output matching circuit 44 and the second output matching circuit 45.

The configuration of the input divider section 12 is not subject to particular limitations, but it is configured to include the phase line 34 in the second path. The configuration of the output synthesizing section 22 is not subject to particular limitations, but it is configured to include the phase line 36 in the third path.

Figure 6:
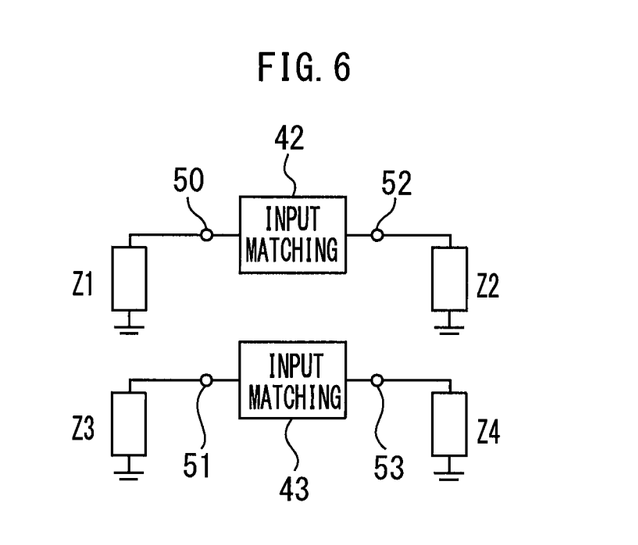
FIG. 6 provides the definition of the coupling amount.

FIG. 6 provides the definition of the coupling amount occurring between the input matching circuits. The coupling amount between two matching circuits is defined by the passage characteristics between the input port of one matching circuit and the output port of the other matching circuit in the state where the input and output terminals of the matching circuits are terminated with impedances Z1, Z2, Z3, and Z4 of the real circuit. In the example depicted in FIG. 6, in advance, the impedance Z2 observed from the first input matching circuit 42 of the circuit depicted in FIG. 5 in the direction toward the first amplifying element 16, and the impedance Z4 observed from the second input matching circuit 43 in the direction toward the second amplifying element 18 are obtained by actual measurement or simulation, and their values are utilized as the terminal impedances of the output ports 52 and 53. Likewise, in the circuit depicted in FIG. 5, the impedance Z1 observed from the first input matching circuit 42 toward the input side and the impedance Z3 observed from the second input matching circuit 43 toward the input side are obtained by actual measurement or simulation, and their values are utilized as the terminal impedances of the input ports 50 and 51 of FIG. 6.

In the measurement, instead of the terminal impedances Z1 and Z4, for example, a measurement instrument such as a network analyzer is connected to the input port 50 and the output port 53 and an S parameter between them is measured. The S parameter that has been measured is put into the circuit simulator, and the passage characteristics between the paths of the input port 50 and the output port 53 are calculated by the simulator, and the coupling amount is computed in the state where the input ports 50, 51 and the output ports 52 and 53 are terminated with the impedances Z1 and Z3 and the impedances Z2 and Z4, respectively. Measurement errors or errors associated with approximate representation of the complex impedance are taken into account, and the degree of reproducibility of the terminal impedances Z1, Z2, Z3, and Z4 is regarded as being valid if the reflection error, that is, the return loss falls within the range of −10 dB or less. While explanations are given in FIG. 6 based on the example of the input matching circuit, the same or similar method is used in the case of the output matching circuit to obtain the coupling amount.

In this embodiment, electromagnetic coupling is established between the signal that passed through the first path and proceeded to the first input matching circuit 42 and the signal that proceeded to the second input matching circuit 43 via the phase line 34 of the second path. Also, electromagnetic coupling is established between the signal that passed through the first amplifying element 16 and proceeded to the first output matching circuit 44 and the signal that passed through the second amplifying element 18 and proceeded to the second output matching circuit 45. By virtue of this, it is made possible to provide an amplifier that operates with high efficiency over a wide band.

In this embodiment, explanations are given based on the case where electromagnetic coupling takes place on both of the input matching circuit and the output matching circuit of the amplifying element, but it may also be contemplated that meaningful electromagnetic coupling only takes place on either of them.

Fourth Embodiment

Figure 7:
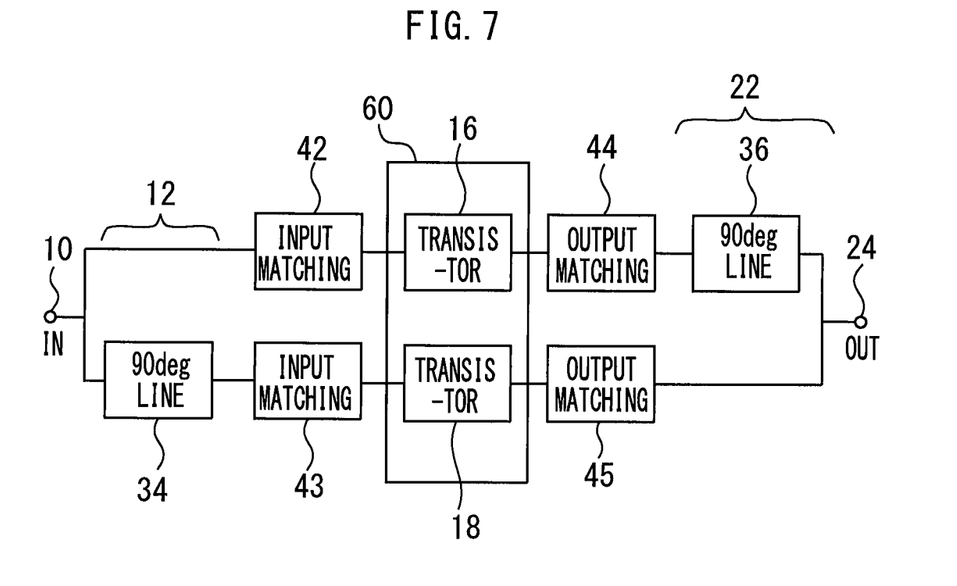
FIG. 7 is a configuration diagram of an amplifier in accordance with the fourth embodiment.
Figure 8:
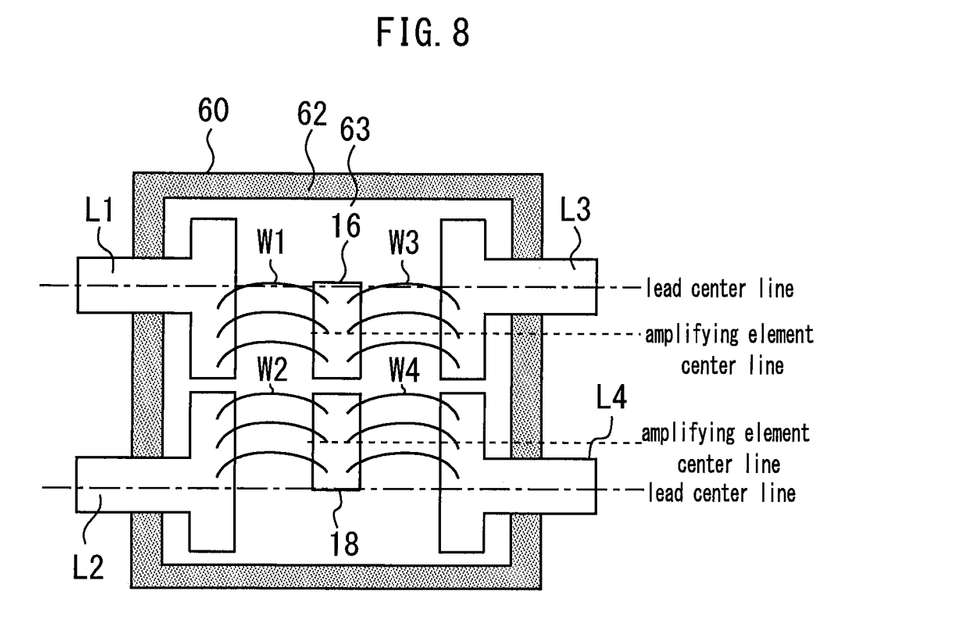
FIG. 8 is a plan view of the semiconductor package.

FIG. 7 is a configuration diagram of an amplifier in accordance with the fourth embodiment. This amplifier includes the first amplifying element 16 and a semiconductor package 60 in which the second amplifying element 18 is implemented. FIG. 8 is a plan view of the semiconductor package 60. The semiconductor package 60 includes a first input lead L1, a second input lead L2, a first output lead L3, a second output lead L4, and a housing 62 and a GND pattern 63 to which these leads are fixed. The first input lead L1, the second input lead L2, the first output lead L3, and the second output lead L4 are package leads.

The semiconductor package 60 further includes a first input wire W1, a second input wire W2, a first output wire W3, and a second output wire W4. The first input wire W1 connects the first input lead L1 and the first amplifying element 16. The second input wire W2 connects the second input lead L2 and the second amplifying element 18. The first output wire W3 connects the first output lead L3 and the first amplifying element 16. The second output wire W4 connects the second output lead L4 and the second amplifying element 18.

The first amplifying element 16 and the second amplifying element 18 are configured by different chips. The first amplifying element 16 and the second amplifying element 18 are, for example, transistor chips. The first input wire W1 is connected to the second input lead L2 side of the first input lead L1 and the second input wire W2 is connected to the first input lead L1 side of the second input lead L2. By virtue of this, the first input wire W1 and the second input wire W2 are placed in proximity to each other, and the first input wire W1 and the second input wire W2 are configured to serve as the electromagnetic coupling section on the input side of the amplifying element. For example, the distance between the first input wire W1 and the second input wire W2 can be defined as 2 mm or less, or equal to or less than a $\frac{1}{100}$ wavelength of the center frequency of the signal band.

The first output wire W3 is connected to the second output lead L4 side of the first output lead L3 and the second output wire W4 is connected to the first output lead L3 side of the second output lead L4. By virtue of this, the first output wire W3 and the second output wire W4 are placed in proximity to each other and the first output wire W3 and the second output wire W4 are configured to serve as the electromagnetic coupling section on the output side of the amplifying element. For example, the distance between the first output wire W3 and the second output wire W4 can be defined as 2 mm or less, or equal to or less than a $\frac{1}{100}$ wavelength of the center frequency of the signal band.

For example, the first amplifying element 16 is arranged such that the center line of the first amplifying element 16 resides more inside than the center lines of the first input lead L1 and the first output lead L3, and the second amplifying element 18 is arranged such that the center line of the second amplifying element 18 resides more inside than the center lines of the second input lead L2 and the second output lead L4. The center lines of the leads are defined as the center line at the portions of the leads extending to the outside of the housing 62. By this feature, the first input wire W1 and the second input wire W2 can be placed in proximity to each other and the first output wire W3 and the second output wire W4 can be placed in proximity to each other.

Propagation of the signals in the amplifier in accordance with the fourth embodiment will now be described. The signal that has been transmitted from the first path of the input divider section 12 to the first input matching circuit 42 travels through the first input lead L1 and the first input wire W1 to be amplified by the first amplifying element 16. Also, the signal that has been transmitted from the second path of the input divider section 12 to the second input matching circuit 43 travels through the second input lead L2 and the second input wire W2 to be amplified by the second amplifying element 18. The signal that has been amplified by the first amplifying element 16 travels through the first output wire W3 and the first output lead L3 to be input to the phase line 36 configured, for example, by a 90 degree line and subjected to synthesis with the signal that has been amplified by the second amplifying element 18 and output via the second output wire W4 and the second output lead L4 and the synthesized signal is thus output.

In this embodiment, the first input wire W1 and the second input wire W2 are placed in proximity to each other and they are made to function as the electromagnetic coupling section, and the first output wire W3 and the second output wire W4 are placed in proximity to each other and they are made to function as the electromagnetic coupling section. This enables the amplifier to have a wider bandwidth. Either of these two electromagnetic coupling sections may be omitted. It should be noted that, in the fourth embodiment, since the electromagnetic coupling section is formed by the wire of the semiconductor package 60, it is not necessary to from an electromagnetic coupling section in the matching circuit.

Fifth Embodiment

Figure 9:
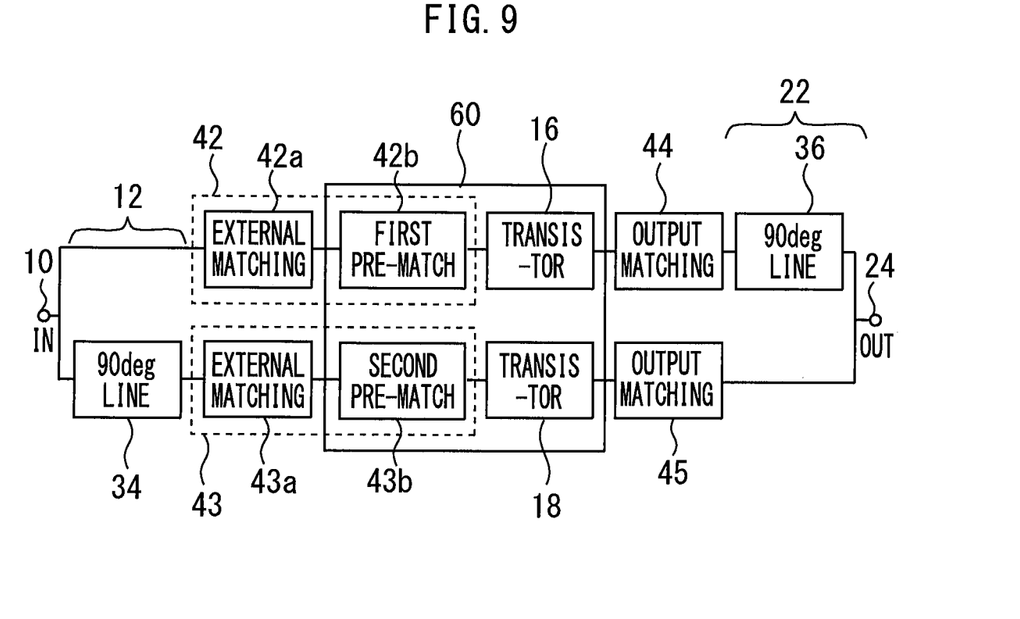
FIG. 9 is a configuration diagram of an amplifier in accordance with the fifth embodiment.

FIG. 9 is a configuration diagram of an amplifier in accordance with the fifth embodiment. The first input matching circuit 42 includes a first external matching circuit 42a and a first pre-match circuit 42b. The second input matching circuit 43 includes a second external matching circuit 43a and a second pre-match circuit 43b. The first pre-match circuit 42b and the second pre-match circuit 43b are provided as part of the semiconductor package 60.

Figure 10:
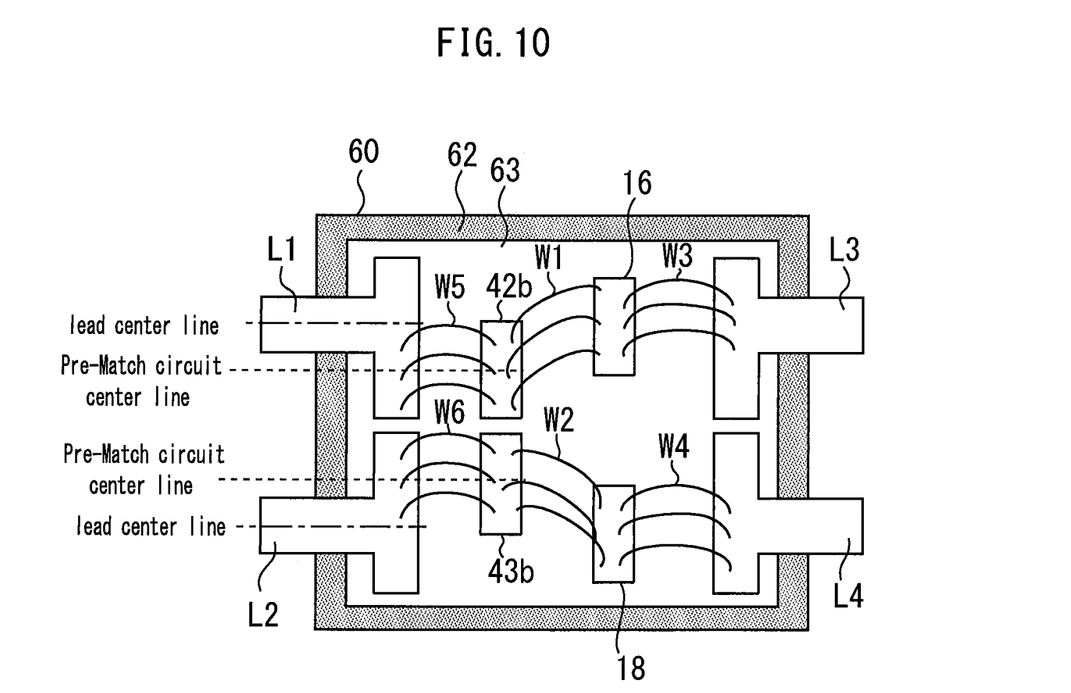
FIG. 10 is a plan view of the semiconductor package.

FIG. 10 is a plan view of the semiconductor package 60 of FIG. 9. The semiconductor package 60 includes a first input lead L1, a second input lead L2, a first output lead L3, a second output lead L4, and a housing 62 and a GND pattern 63 to which these leads are fixed. The first input lead L1, the second input lead L2, the first output lead L3, and the second output lead L4 are package leads.

The semiconductor package 60 further includes a first pre-match circuit 42b, a second pre-match circuit 43b, a first connection wire W5, a first input wire W1, a first output wire W3, a second connection wire W6, a second input wire W2, and a second output wire W4. The first pre-match circuit 42b and the second pre-match circuit 43b are configured by different chips.

The first connection wire W5 connects the first input lead L1 and the first pre-match circuit 42b. The first input wire W1 connects the first pre-match circuit 42b and the first amplifying element 16. The first output wire W3 connects the first output lead L3 and the first amplifying element 16. The second connection wire W6 connects the second input lead L2 and the second pre-match circuit 43b. The second input wire W2 connects the second pre-match circuit 43b and the second amplifying element 18. The second output wire W4 connects the second output lead L4 and the second amplifying element 18.

The first amplifying element 16 and the second amplifying element 18 are configured by different chips. The first connection wire W5 is connected to the second input lead L2 side of the first input lead L1, and the second connection wire W6 is connected to the first input lead L1 side of the second input lead L2. By virtue of this, the first connection wire W5 and the second connection wire W6 are placed in proximity to each other and the first connection wire W5 and the second connection wire W6 are configured to serve as the electromagnetic coupling section.

For example, the first pre-match circuit 42b is arranged such that the center line of the first pre-match circuit 42b resides more inside than the center lines of the first input lead L1 and the first output lead L3. Further, the second pre-match circuit 43b is arranged such that the center line of the second pre-match circuit 43b resides more inside than the center lines of the second input lead L2 and the second output lead L4. The center lines of the leads are defined as the center line at the portion of the leads extending to the outside of the housing 62. By this feature, the first connection wire W5 and the second connection wire W6 can be placed in proximity to each other.

In this embodiment, the first connection wire W5 and the second connection wire W6 are placed in proximity to each other and they are made to function as the electromagnetic coupling section. This enables the amplifier to have a wider bandwidth. In the fifth embodiment, since the electromagnetic coupling section is formed by the wire of the semiconductor package 60, it is not necessary to form an electromagnetic coupling section in the input matching circuit. Any of the electromagnetic coupling sections that have been described in the foregoing in the context of the embodiments may also be provided so as to provide the electromagnetic coupling section on the output side of the first amplifying element 16 and the second amplifying element 18.

Figure 11:
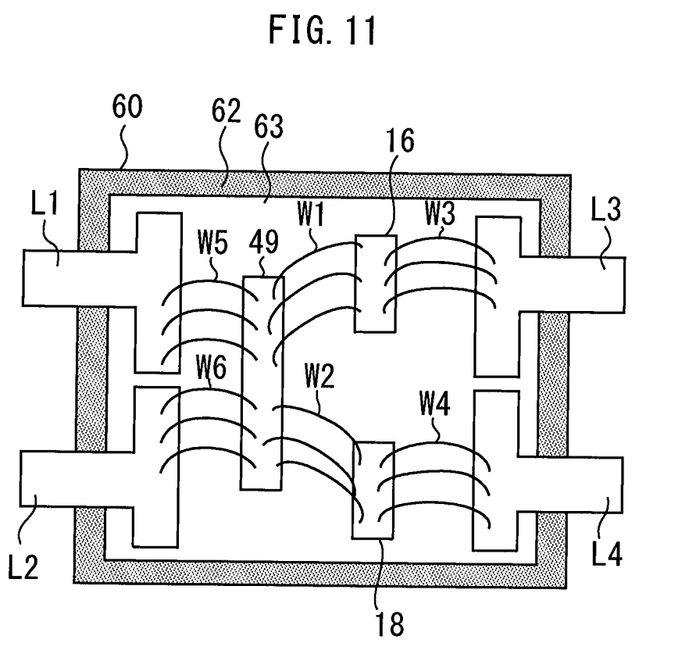
FIG. 11 is a plan view of a semiconductor package in accordance with a modified example.

FIG. 11 is a plan view of a semiconductor package in accordance with a modified example. The first pre-match circuit and the second pre-match circuit are formed on one single chip 49. In other words, the first pre-match circuit 42b and the second pre-match circuit 43b of FIG. 10 are integrated. This configuration is suitable in placing the first connection wire W5 and the second connection wire W6 in further proximity to each other.

Sixth Embodiment

Figure 12:
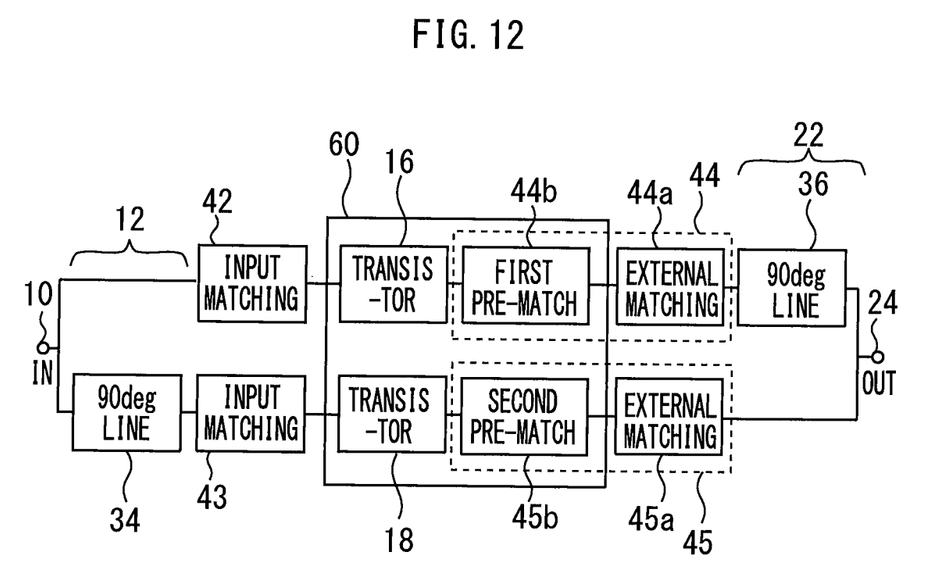
FIG. 12 is a configuration diagram of the amplifier in accordance with the sixth embodiment.

FIG. 12 is a configuration diagram of the amplifier in accordance with the sixth embodiment. In this amplifier, the feature described in the fifth embodiment that the wire connected to the pre-match circuit is configured as an electromagnetic coupling section is applied to the output side of the amplifying element. The first output matching circuit 44 includes a first external matching circuit 44a and a first pre-match circuit 44b. The second output matching circuit 45 includes a second external matching circuit 45a and a second pre-match circuit 45b. The first pre-match circuit 44b and the second pre-match circuit 45b are provided as part of the semiconductor package 60.

Figure 13:
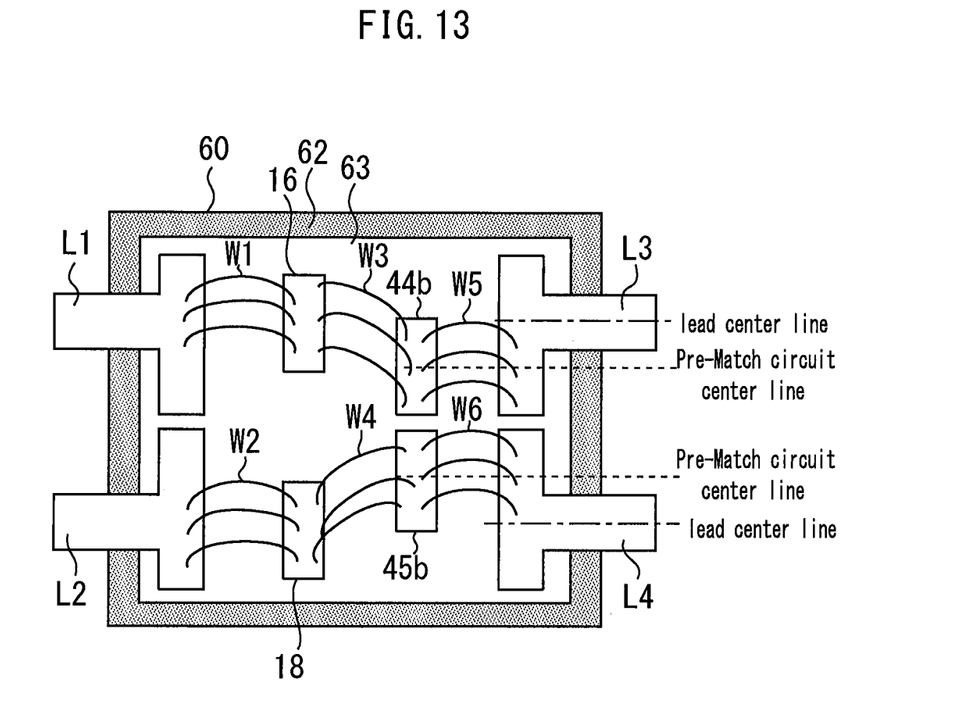
FIG. 13 is a plan view of the semiconductor package.

FIG. 13 is a plan view of the semiconductor package 60 of FIG. 12. The semiconductor package 60 includes a first pre-match circuit 44b, a second pre-match circuit 45b, a first connection wire W5, a first input wire W1, a first output wire W3, a second connection wire W6, a second input wire W2, and a second output wire W4. The first pre-match circuit 44b and the second pre-match circuit 45b are configured by different chips.

As illustrated in FIG. 13, the first input wire W1 connects the first input lead L1 and the first amplifying element 16. The second input wire W2 connects the second input lead L2 and the second amplifying element 18. The first output wire W3 connects the first amplifying element 16 and the first pre-match circuit 44b. The first connection wire W5 connects the first pre-match circuit 44b and the first output lead L3. The second output wire W4 connects the second amplifying element 18 and the second pre-match circuit 45b. The second connection wire W6 connects the second pre-match circuit 45b and the second output lead L4.

By connecting the first connection wire W5 to the second output lead L4 side of the first output lead L3 and connecting the second connection wire W6 to the first output lead L3 side of the second output lead L4, the first connection wire W5 and the second connection wire W6 can be configured to serve as an electromagnetic coupling section. The foregoing discussion about the center line may be applied to this configuration. It should be noted that the first pre-match circuit 44b and the second pre-match circuit 45b may be provided on different chips and may also be formed on one single chip as in the case of the chip 49 of FIG. 11.

The amplifiers in accordance with the embodiments described in the foregoing can be used as a high frequency amplifier that amplifies broadband wireless signals in a transmitter for wireless communications, or amplifies signals that span multiple frequency bands.

DESCRIPTION OF SYMBOLS 10 input terminal, 12 input divider section, 14, 20 electromagnetic coupling section, 16 first amplifying element, 18 second amplifying element

The invention claimed is:
1. An amplifier comprising:
an input divider section having a first path and a second path for branching of an input signal, wherein a passing phase at the first path and a passing phase at the second path are different from each other;
a first amplifying element that amplifies a signal input to the first path;
a second amplifying element that amplifies a signal input to the second path;
an output synthesizing section that performs synthesis of an output of the first amplifying element and an output of the second amplifying element with a third path for transmitting the output of the first amplifying element and a fourth path for transmitting the output of the second amplifying element, wherein a passing phase at the third path and a passing phase at the fourth path are different from each other;
an electromagnetic coupling section that establishes electromagnetic coupling of two signals passing through the input divider section to be input to the first amplifying element and the second amplifying element, or two signals output from the first amplifying element and the second amplifying element and input to the output synthesizing section,
a first input matching circuit provided between the first path and the first amplifying element;
a second input matching circuit provided between the second path and the second amplifying element;
a first output matching circuit provided between the first amplifying element and the third path; and
a second output matching circuit provided between the second amplifying element and the fourth path, wherein
at least one of:
the electromagnetic coupling section is provided in the first input matching circuit and the second input matching circuit, and part of the first input matching circuit and part of the second input matching circuit face each other without a GND pattern residing therebetween and thereby a portion having a coupling amount of −20 dB or more and −3 dB or less is configured to serve as the electromagnetic coupling section, or
the electromagnetic coupling section is provided in the first output matching circuit and the second output matching circuit, and part of the first output matching circuit and part of the second output matching circuit face each other without a GND pattern residing therebetween and thereby a portion having a coupling amount of −20 dB or more and −3 dB or less is configured to serve as the electromagnetic coupling section.

2. The amplifier according to claim 1, wherein the electromagnetic coupling section is a coupling circuit provided between (a) the input divider section and (b) the first amplifying element and the second amplifying element.

3. The amplifier according to claim 1, wherein the electromagnetic coupling section is a coupling circuit provided between (a) the first amplifying element and the second amplifying element and (b) the output synthesizing section.

4. The amplifier according to claim 1, wherein the input divider section has a 90 degree hybrid circuit and the output synthesizing section has a 90 degree hybrid circuit.

5. The amplifier according to claim 1, wherein
the input divider section has a phase line in the second path,
the output synthesizing section has a phase line in the third path, and
the electromagnetic coupling section is a coupling circuit provided between (a) the input divider section and (b) the first amplifying element and the second amplifying element.

6. The amplifier according to claim 1, wherein
the input divider section has a phase line in the second path,
the output synthesizing section has a phase line in the third path, and
the electromagnetic coupling section is a coupling circuit provided between (a) the first amplifying element and the second amplifying element and (b) the output synthesizing section.

7. The amplifier according to claim 5, wherein the phase line includes a 90 degree phase shifter.

8. The amplifier according to claim 1, wherein the input divider section has a phase line in the second path and the output synthesizing section has a phase line in the third path.

9. The amplifier according to claim 1, comprising a semiconductor package which includes: a first input lead; a first input wire that connects the first input lead and the first amplifying element; a second input lead; a second input wire that connects the second input lead and the second amplifying element; a first output lead; a first output wire that connects the first output lead and the first amplifying element; a second output lead; and a second output wire that connects the second output lead and the second amplifying element, wherein
the first amplifying element and the second amplifying element are configured by different chips, and
the first input wire is connected to the second input lead side of the first input lead, the second input wire is connected to the first input lead side of the second input lead, and thereby the first input wire and the second input wire are configured to serve as the electromagnetic coupling section.

10. The amplifier according to claim 9, wherein a distance between the first input wire and the second input wire is 2 mm or less, or a 1/100 wavelength or less of a center frequency of a signal band.

11. The amplifier according to claim 1, comprising a semiconductor package which includes: a first input lead; a first input wire that connects the first input lead and the first amplifying element; a second input lead; a second input wire that connects the second input lead and the second amplifying element; a first output lead; a first output wire that connects the first output lead and the first amplifying element; a second output lead; and a second output wire that connects the second output lead and the second amplifying element, wherein
the first amplifying element and the second amplifying element are configured by different chips, and
the first output wire is connected to the second output lead side of the first output lead, the second output wire is connected to the first output lead side of the second output lead, and thereby the first output wire and the second output wire are configured to serve as the electromagnetic coupling section.

12. The amplifier according to claim 11, wherein a distance between the first output wire and the second output wire is 2 mm or less, or a 1/100 wavelength or less of a center frequency of a signal band.

13. The amplifier according to claim 1, comprising a semiconductor package which includes: a first input lead; a first pre-match circuit; a first connection wire that connects the first input lead and the first pre-match circuit; a first input wire that connects the first pre-match circuit and the first amplifying element; a second input lead; a second pre-match circuit; a second connection wire that connects the second input lead and the second pre-match circuit; a second input wire that connects the second pre-match circuit and the second amplifying element; a first output lead; a first output wire that connects the first output lead and the first amplifying element; a second output lead; and a second output wire that connects the second output lead and the second amplifying element, wherein
the first amplifying element and the second amplifying element are configured by different chips, and
the first connection wire is connected to the second input lead side of the first input lead, the second connection wire is connected to the first input lead side of the second input lead, and thereby the first connection wire and the second connection wire are configured to serve as the electromagnetic coupling section.

14. The amplifier according to claim 1, comprising a semiconductor package which includes: a first input lead; a first input wire that connects the first input lead and the first amplifying element; a second input lead; a second input wire that connects the second input lead and the second amplifying element; a first pre-match circuit; a first output lead; a first output wire that connects the first amplifying element and the first pre-match circuit; a first connection wire that connects the first pre-match circuit and the first output lead; a second pre-match circuit; a second output lead; a second output wire that connects the second amplifying element and the second pre-match circuit; and a second connection wire that connects the second pre-match circuit and the second output lead, wherein
the first amplifying element and the second amplifying element are configured by different chips, and
the first connection wire is connected to the second output lead side of the first output lead, the second connection wire is connected to the first output lead side of the second output lead, and thereby the first connection wire and the second connection wire are configured to serve as the electromagnetic coupling section.

15. The amplifier according to claim 13, wherein the first pre-match circuit and the second pre-match circuit are formed on one chip.

16. An amplifier comprising:
an input divider section having a first path and a second path for branching of an input signal, wherein a passing phase at the first path and a passing phase at the second path are different from each other;
a first amplifying element that amplifies a signal input to the first path;
a second amplifying element that amplifies a signal input to the second path;
an output synthesizing section that performs synthesis of an output of the first amplifying element and an output of the second amplifying element with a third path for transmitting the output of the first amplifying element and a fourth path for transmitting the output of the second amplifying element, wherein a passing phase at the third path and a passing phase at the fourth path are different from each other;
an electromagnetic coupling section that establishes electromagnetic coupling of two signals passing through the input divider section to be input to the first amplifying element and the second amplifying element, or two signals output from the first amplifying element and the second amplifying element and input to the output synthesizing section; and
a semiconductor package which includes: a first input lead; a first input wire that connects the first input lead and the first amplifying element; a second input lead; a second input wire that connects the second input lead and the second amplifying element; a first output lead; a first output wire that connects the first output lead and the first amplifying element; a second output lead; and a second output wire that connects the second output lead and the second amplifying element, wherein
the first amplifying element and the second amplifying element are configured by different chips, and
at least one of:
the first input wire is connected to the second input lead side of the first input lead, the second input wire is connected to the first input lead side of the second input lead, and thereby the first input wire and the second input wire are configured to serve as the electromagnetic coupling section, or the first output wire is connected to the second output lead side of the first output lead, the second output wire is connected to the first output lead side of the second output lead, and thereby the first output wire and the second output wire are configured to serve as the electromagnetic coupling section.

17. An amplifier comprising:

an input divider section having a first path and a second path for branching of an input signal, wherein a passing phase at the first path and a passing phase at the second path are different from each other;

a first amplifying element that amplifies a signal input to the first path;

a second amplifying element that amplifies a signal input to the second path;

an output synthesizing section that performs synthesis of an output of the first amplifying element and an output of the second amplifying element with a third path for transmitting the output of the first amplifying element and a fourth path for transmitting the output of the second amplifying element, wherein a passing phase at the third path and a passing phase at the fourth path are different from each other;

an electromagnetic coupling section that establishes electromagnetic coupling of two signals passing through the input divider section to be input to the first amplifying element and the second amplifying element, or two signals output from the first amplifying element and the second amplifying element and input to the output synthesizing section; and a semiconductor package which includes: a first input lead; a first pre-match circuit; a first connection wire that connects the first input lead and the first pre-match circuit; a first input wire that connects the first pre-match circuit and the first amplifying element; a second input lead; a second pre-match circuit; a second connection wire that connects the second input lead and the second pre-match circuit; a second input wire that connects the second pre-match circuit and the second amplifying element; a first output lead; a first output wire that connects the first output lead and the first amplifying element; a second output lead; and a second output wire that connects the second output lead and the second amplifying element, wherein the first amplifying element and the second amplifying element are configured by different chips, and at least one of:

the first connection wire is connected to the second input lead side of the first input lead, the second connection wire is connected to the first input lead side of the second input lead, and thereby the first connection wire and the second connection wire are configured to serve as the electromagnetic coupling section, or the first connection wire is connected to the second output lead side of the first output lead, the second connection wire is connected to the first output lead side of the second output lead, and thereby the first connection wire and the second connection wire are configured to serve as the electromagnetic coupling section.

* * * * *